United States Patent
Sirito-Olivier

(10) Patent No.: US 7,123,092 B2
(45) Date of Patent: Oct. 17, 2006

(54) DIFFERENTIAL AMPLIFIER WITH LIMITATION OF HIGH COMMON MODE OUTPUT VOLTAGES

(75) Inventor: Philippe Sirito-Olivier, Carro par Martigues (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/944,679

(22) Filed: Sep. 17, 2004

(65) Prior Publication Data

US 2005/0104660 A1    May 19, 2005

(30) Foreign Application Priority Data

Sep. 18, 2003  (IT)  .......................... VA2003A0034

(51) Int. Cl.
*H03F 3/45* (2006.01)
(52) U.S. Cl. ....................... 330/252; 330/258
(58) Field of Classification Search ............... 330/252, 330/258
See application file for complete search history.

(56) References Cited

U.S. PATENT DOCUMENTS 4,904,953 A * 2/1990 McCormack ............... 330/258
5,221,909 A * 6/1993 Cole .......................... 330/253

* cited by examiner

*Primary Examiner*—Khanh Van Nguyen
(74) *Attorney, Agent, or Firm*—Lisa K. Jorgenson; Allen, Dyer, Doppelt, Milbrath & Gilchrist, P.A.

(57) ABSTRACT

A differential amplifier includes a pair of first and second transistors connected together. The first transistor includes a first conduction terminal, and a second conduction terminal forming a first output node of the amplifier. The second transistor includes a first conduction terminal connected to the first conduction terminal of the first transistor, and a second conduction terminal forming a second output node of the amplifier. A first inductive load is connected between the first output node and a supply reference, and a second inductive load is connected between the second output node and the supply reference. A limiting network limits output voltages on the first and second output nodes, and includes a first resistor connected to the first output node, and a second resistor connected to the second output node. The first and second resistors also connected together in series at a common intermediate node. A first analog switch is connected to the first resistor and to the supply reference, and a second analog switch connected to the second resistor and the supply reference via the first analog switch. The first and second analog switches are turned on when a voltage on the common intermediate node exceeds a threshold.

23 Claims, 4 Drawing Sheets

DIFFERENTIAL AMPLIFIER WITH LIMITATION OF HIGH COMMON MODE OUTPUT VOLTAGES

FIELD OF THE INVENTION

The present invention relates to differential amplifiers, and more particularly, to a differential amplifier with a network for limiting output voltages.

BACKGROUND OF THE INVENTION

An architecture of a differential amplifier commonly used in modern electronic circuits is the so-called open collector architecture. In particular, the open collector architecture is used when an amplifier is required to exchange current with external components. In this situation, the collectors of the differential pair of transistors are coupled to connection pins. The amplifier is supplied by connecting these pins to a DC line through external components.

A typical connection scheme of an open collector differential pair of transistors Q1, Q2 to a supply line by external inductive loads L1, L2 is depicted in FIG. 1. These inductive loads L1, L2 are used for doubling the output voltage swing, which becomes twice the supply voltage.

In the shown example, the AC components of the voltages on the output nodes C1 and C2 are floating, and also depend on the signals applied on the control nodes of the transistors of the differential pair Q1, Q2. This is while the respective DC components are set by the value of the supply voltage VDD.

In these amplifiers it may happen that the voltages on the nodes C1, C2 reach values larger than those established by the technology used. This is due to the spurious common mode, or differential voltages due to inductive loads connected to the nodes C1, C2 and the supply line VDD.

In particular, when the differential amplifier is turned on or off, there are spurious voltage peaks of equal amplitude. The voltage peaks are in phase between them (common mode) on both nodes C1, C2 due to the rapid variations of the current flowing in the inductances L1, L2 superposed to the output voltages, thus raising their level.

To address this problem, several architectures of open collector differential pairs having networks for limiting the output voltage are known. A first example is shown in FIG. 2, wherein each collector node is connected to the supply line by a certain number N of diodes D1, ..., Dn connected in series. Since VT is the voltage for turning on the diodes (typically 0.8V), when the voltages on the collector nodes C1 and C2 reach the threshold value given by

VDD+N*VT the N diodes D1, ..., Dn are turned on and limit the maximum voltage on the nodes C1 and C2. This approach effectively limits the voltages on the output nodes both in presence of spurious common mode and differential over voltages.

A drawback of this architecture is that the series of diodes do not turn on instantaneously, but gradually enter in a conduction state. Thus, they distort the output signal when its amplitude is smaller than the threshold value N*VT. Using this limitation network causes a relevant harmonic distortion.

Another architecture is shown in FIG. 3. In this case, the collector nodes are connected by two diode series D1, ..., Dn connected in parallel. When the differential voltage on the nodes C1 and C2 equals the product N*VT, one of the two series of diodes enters in a conduction state and limits this differential voltage.

The effect of the protection network shown in FIG. 3 is that of reducing the output differential voltage when this voltage reaches too a large value. The protection network does not intervene when at the turning on or off of the device there are spurious common mode voltage peaks on the nodes C1 and C2. Moreover, even in this case, the diodes cause an increase of the harmonic distortion of the output signal.

SUMMARY OF THE INVENTION

An object of the invention is to provide a differential amplifier that addresses the above mentioned problems by using a network for limiting the output common mode voltage. The network is to connect the output nodes to the supply voltage through respective low impedance paths when the output voltage exceeds a pre-established maximum value.

More precisely, the differential amplifier comprises a differential pair of transistors the current nodes of which, forming respective output nodes of the amplifier, are connected to a supply line through respective inductive loads. A network for limiting output voltages comprising a pair of low impedance paths. Each path connects a respective output node to the supply line, and has an analog switch turned on when a certain voltage threshold is surpassed.

The limiting network does not intervene during the normal functioning of the amplifier but limits the common mode voltage because it comprises a pair of identical resistors connected in series between the output nodes of the amplifier. Also, because both analog switches are turned on when the voltage on the intermediate common node of the identical resistances in series overcomes the pre-established thresholds.

BRIEF DESCRIPTION OF THE DRAWINGS

The various aspects and advantages on the invention will be even more evident through a detailed description referring to the attached drawings, wherein.

DETAILED DESCRIPTION OF THE PREFERRED EMBODIMENTS

Figure 1:
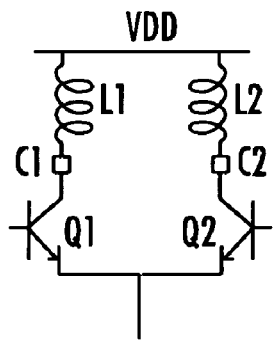
FIG. 1 shows an architecture of an open collector differential amplifier according to the prior art.
Figure 2:
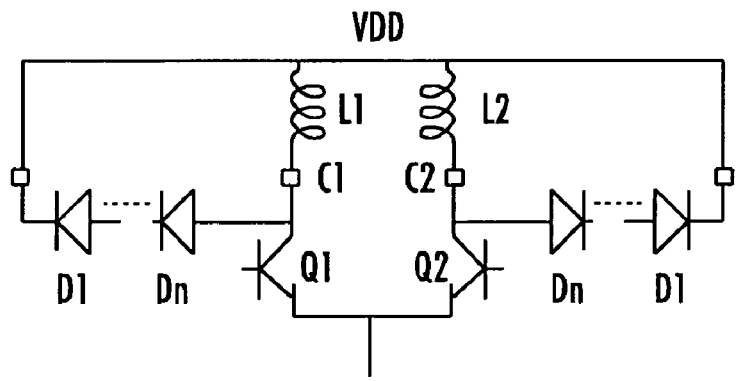
FIG. 2 shows an open collector differential amplifier with diodes for limiting the voltage on the output nodes according to the prior art.
Figure 3:
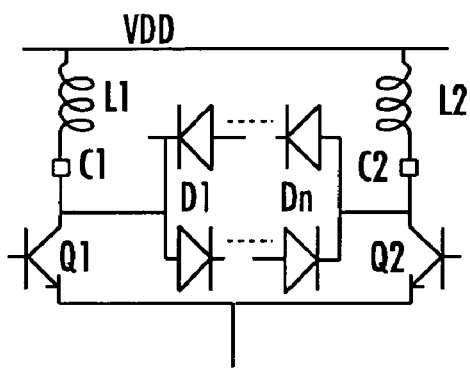
FIG. 3 shows an open collector differential amplifier with diodes for limiting the output differential voltage according to the prior art.
Figure 4:
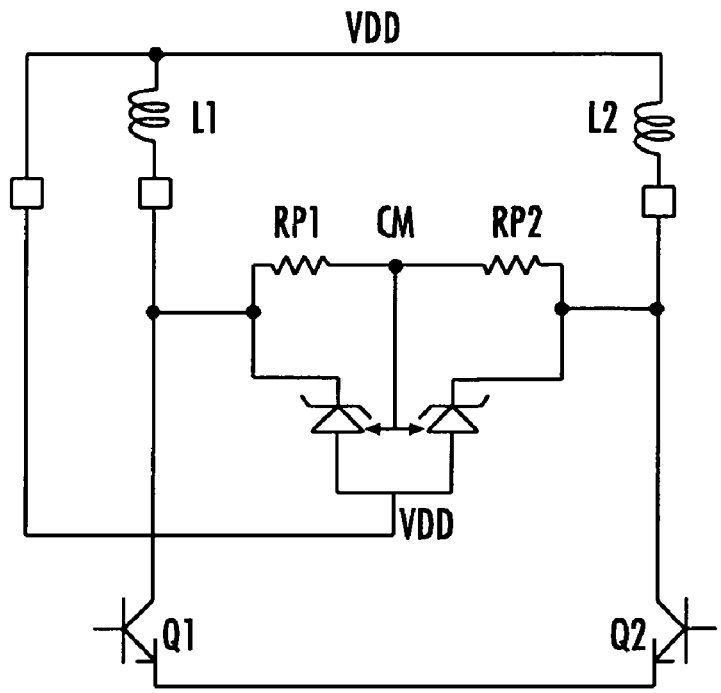
FIG. 4 shows a basic architecture of the differential amplifier of the invention.

A basic diagram of the differential amplifier of the invention is depicted in FIG. 4. It comprises a network for limiting the output voltages connected between the output nodes C1, C2 and the supply VDD. In this figure, as in the following ones, the load resistance connected between the output nodes is not shown, but it should be considered as present.

The voltage on the common node CM of the two identical resistors RP1 is the output common mode voltage. When there is not any spurious common mode over voltage, it coincides with the supply voltage VDD.

A pair of analog switches are connected between the output nodes of the amplifier and the supply line and are turned on by a control voltage equal to the difference between the voltage on the node CM and the voltage VDD. When this difference exceeds a threshold value, the analog switches are in a conduction state and connect the nodes C1, C2 to the supply line VDD through low impedance paths, as long as the difference between the voltage on the node CM and supply voltage does not diminish below the threshold.

Should differential spurious voltages be present, the voltage on the node CM remains unchanged and the limiting network does not intervene. To regulate the activation threshold of the protection network from common mode over voltages, a resistor RP2 is connected between the common node CM and the supply line to form with the resistor RP1 a pair of resistive voltage dividers between the nodes C1, C2 and the supply VDD.

Figure 5:
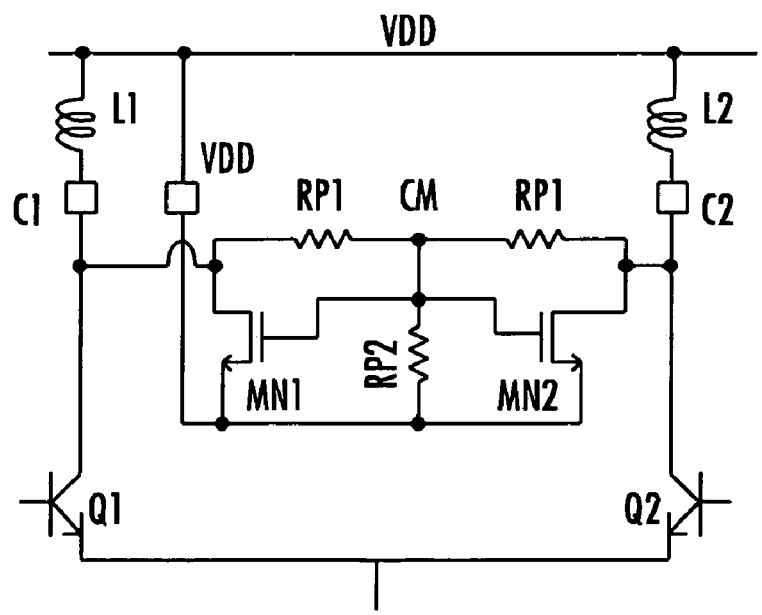
FIG. 5 shows an embodiment in MOS technology of the differential amplifier of the invention.

FIG. 5 depicts an embodiment of the amplifier of the invention in MOS technology. The two analog switches that connect the nodes C1, C2 to the supply line are two identical MOSFETs MN1, MN2 that both turn on when the voltage on the node CM exceeds the supply voltage of a quantity equal to the threshold voltage of the MOSFETs.

Figure 6:
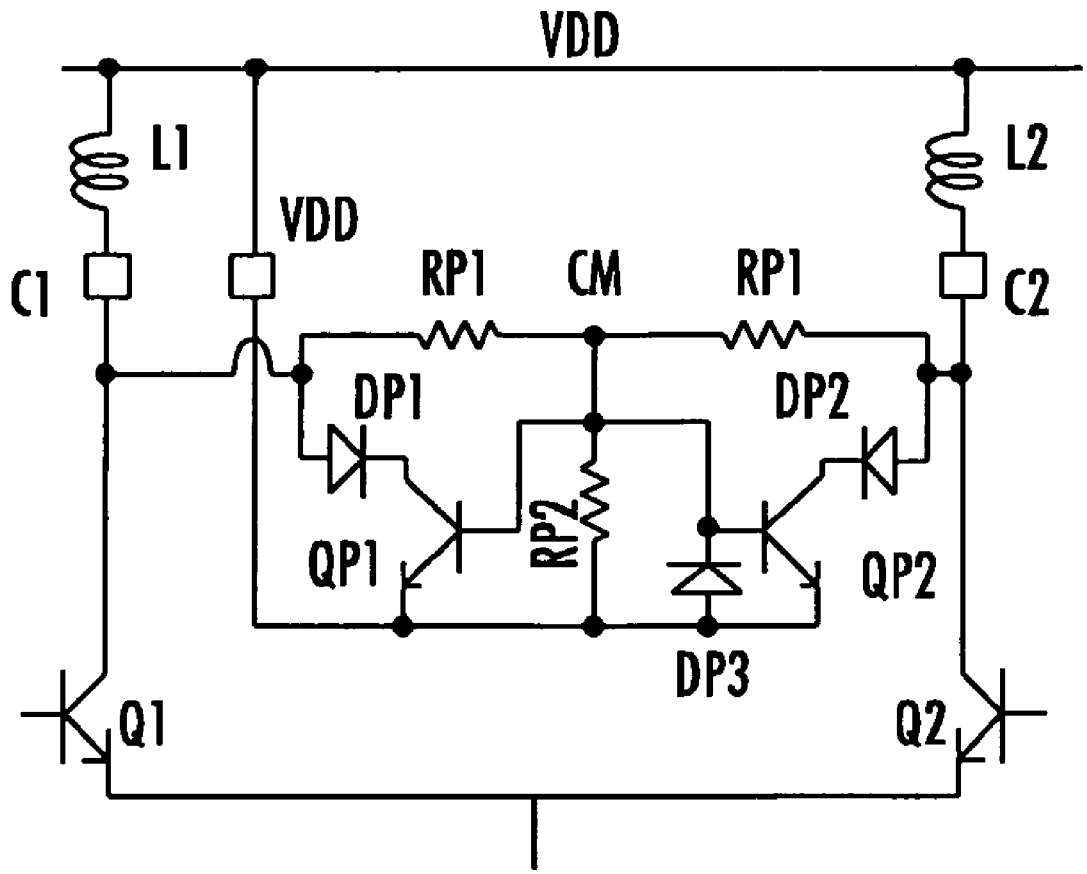
FIG. 6 shows an embodiment in bipolar technology of the differential amplifier of the invention.

The limiting network of the amplifier of the invention may also be formed using bipolar transistors, as depicted in FIG. 6. In this case it is convenient to add the diodes DP1 and DP2 to prevent voltage swings on the nodes C1, C2 below the voltage VDD for turning on the intrinsic base-collector diodes of the transistors QP1, QP2. Preferably, a protection diode DP3 is connected as depicted in figure to limit the inverse negative swing of the base-emitter voltage of these transistors.

In the shown examples the differential amplifier is formed by a differential pair of bipolar transistors Q1, Q2, but it is possible to use MOSFETs or even Darlington transistors.

Figure 7:
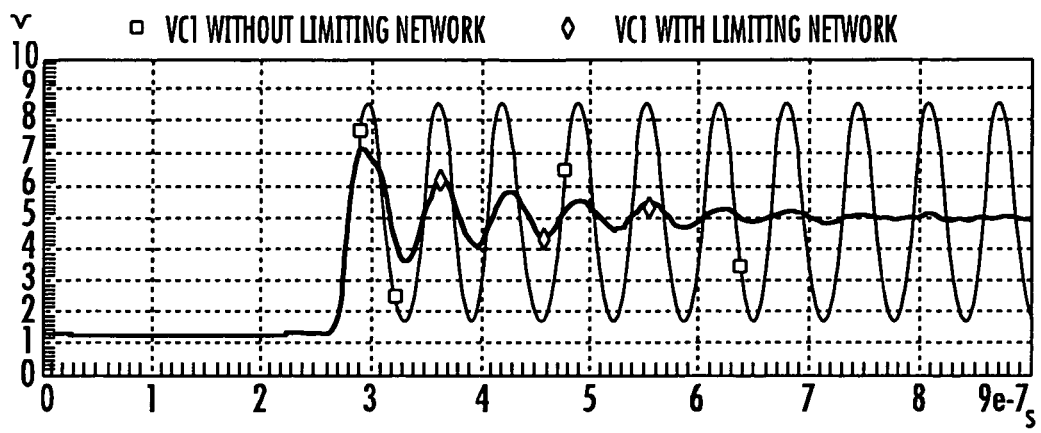
FIG. 7 is a graph of the output voltages of the differential amplifier of FIG. 6 after a spurious common mode voltage pulse.

FIG. 7 is a graph of the voltage VC1 on the node C1 for the circuit of FIG. 6 with the limiting network compared with a graph of the same voltage without the limiting network and the load resistance. This is after a spurious common mode square wave voltage pulse that lowered the voltage on the node C1 from 5V to little more than 1V. For this last simulation no load resistance connecting the two output nodes has been considered. This is to better highlight the effect of the spurious pulse, and the following values have been used:

VDD=5V; RP1=50 kΩ; RP2=15 kΩ; L1=L2=100 µH.

Without the limiting network the oscillations of the voltage VC1 are not dampened rapidly (the chosen time scale does not allow the dampening to be illustrated), while with the limiting network the oscillations are immediately limited to the maximum value of 7V from the turning on of the transistors QP1, QP2. The exponential dampening is determined by the circuit R-L composed of inductive loads L1, L2 and by the load resistance (not depicted in figure) connected between the output nodes C1, C2.

Figure 8A:
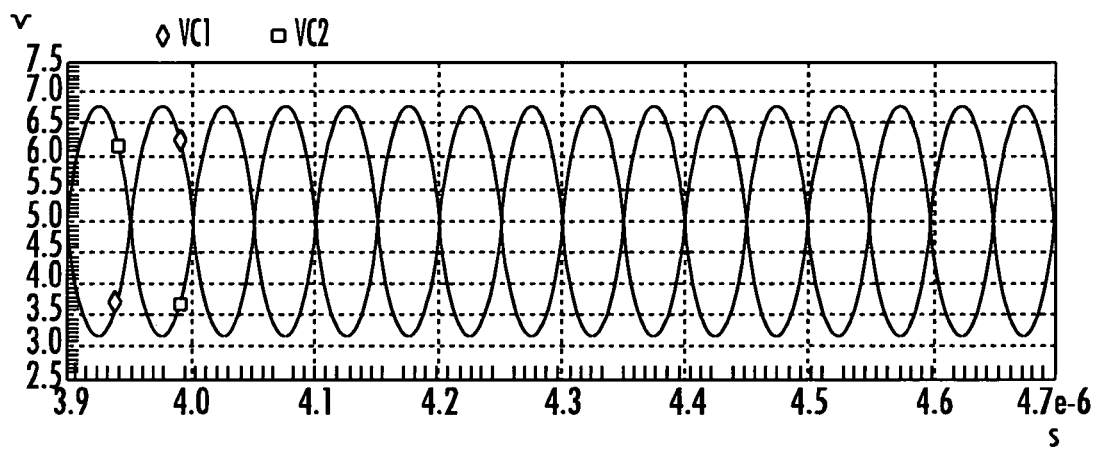
FIGS. 8a and 8b are graphs of the output voltages during a normal functioning phase of the amplifier of the invention.
Figure 8B:
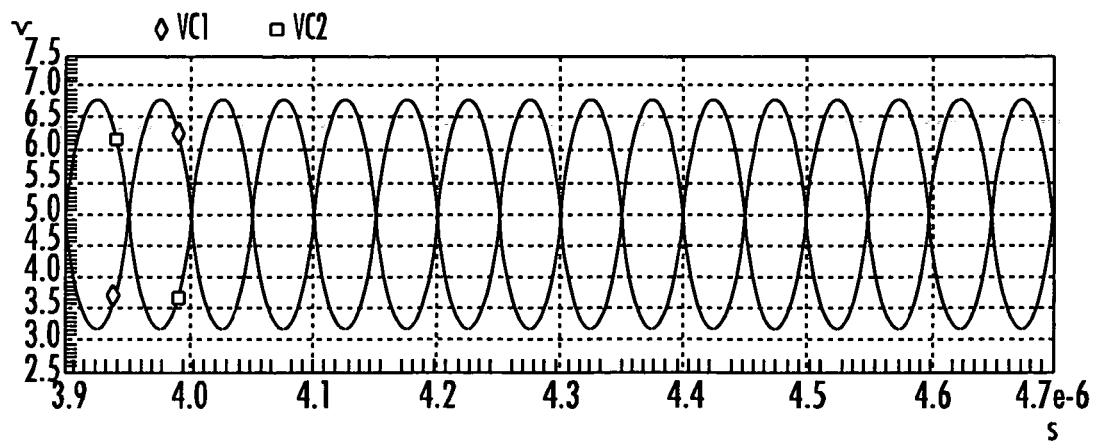

FIGS. 8a and 8b depict graphs of the voltages VC1, VC2 on the output nodes C1 and C2 after an input sine differential signal at a frequency of 10 MHz, with and without the limiting network, respectively. The limiting network practically does not influence the response of the amplifier during its normal functioning because the limiting circuit is not sensitive to differential signals.

The invention claimed is:

1. A differential amplifier comprising:
   a differential pair of transistors comprising
      a first transistor including a first conduction terminal, and a second conduction terminal forming a first output node of the differential amplifier, and
      a second transistor including a first conduction terminal connected to the first conduction terminal of said first transistor, and a second conduction terminal forming a second output node of the differential amplifier;
   a first inductive load connected between the first output node and a supply reference, and a second inductive load connected between the second output node and the supply reference;
   a limiting network for limiting output voltages on the first and second output nodes, and comprising
      a first resistor connected to the first output node, and a second resistor connected to the second output node, said first and second resistors also connected together in series at a common intermediate node, and
      a first analog switch connected to said first resistor and to the supply reference, and a second analog switch connected to said second resistor and the supply reference, said first and second analog switches being connected together at a common node also connected to the supply reference, and said first and second analog switches being turned on when a voltage on the common intermediate node exceeds a threshold; and
   a third resistor connected between the common intermediate node and the common node.

2. A differential amplifier according to claim 1, wherein said first and second resistors are identical.

3. A differential amplifier according to claim 1, wherein each of said first and second analog switches comprises a MOS transistor.

4. A differential amplifier comprising:
   a differential pair of transistors comprising
      a first transistor including a first conduction terminal, and a second conduction terminal forming a first output node of the differential amplifier, and
      a second transistor including a first conduction terminal connected to the first conduction terminal of said first transistor, and a second conduction terminal forming a second output node of the differential amplifier;
   a first load connected between the first output node and a supply reference, and a second load connected between the second output node and the supply reference; and
   a limiting network for limiting output voltages on the first and second output nodes, and comprising
      a first resistor connected to the first output node, and a second resistor connected to the second output node, said first and second resistors also connected together in series at a common intermediate node,
      a first transistor switch including a control terminal, a first conducting terminal connected to the first output node, and a second conducting terminal connected to the supply reference, and
      a second transistor switch including a control terminal connected to the control terminal of said first transistor switch, a first conducting terminal connected to the second output node, and a second conducting terminal connected to the second conducting terminal of said first transistor switch.

5. A differential amplifier according to claim 4, wherein said first and second transistor switches are turned on when a voltage on the common intermediate node exceeds a threshold.

6. A differential amplifier according to claim 4, wherein each of said first and second loads comprises an inductive load.

7. A differential amplifier according to claim 4, wherein said first and second resistors are identical.

8. A differential amplifier according to claim 4, wherein the second conducting terminals of said first and second transistor switches are connected together at a common node; and further comprising a third resistor connected between the common intermediate node and the common node.

9. A differential amplifier according to claim 4, wherein each of said first and second transistor switches comprises a MOS transistor.

10. A differential amplifier according to claim 4, further comprising
a first voltage limiting diode connected between the first output node and the first conducting terminal of said first transistor switch; and
a second voltage limiting diode connected between the second output node and the first conducting terminal of said second transistor switch.

11. A differential amplifier according to claim 10, further comprising a third voltage limiting diode having a first terminal connected to the control terminals of said first and second transistor switches, and a second terminal connected to the second conduction terminals of said first and second transistor switches for limiting an inverse voltage between said first and second transistor switches.

12. A differential amplifier according to claim 4, wherein each of said first and second transistor switches comprises a bipolar transistor.

13. A method for making a differential amplifier comprising;
forming a differential pair of transistors comprising
a first transistor including a first conduction terminal, and a second conduction terminal forming a first output node of the differential amplifier, and
a second transistor including a first conduction terminal connected to the first conduction terminal of the first transistor, and a second conduction terminal forming a second output node of the differential amplifier;
connecting a first inductive load between the first output node and a supply reference, and connecting a second inductive load between the second output node and the supply reference;
forming a limiting network for limiting output voltages on the first and second output nodes, and comprising
connecting a first resistor to the first output node, and connecting a second resistor connected to the second output node, the first and second resistors also being connected together in series at a common intermediate node, and
connecting a first analog switch to the first resistor and to the supply reference, and connecting a second analog switch connected to the second resistor and the supply reference, the first and second analog switches being connected together at a common node also connected to the supply reference, and the first and second analog switches being turned on when a voltage on the common intermediate node exceeds a threshold; and
connecting a third resistor between the common intermediate node and the common node.

14. A method according to claim 13, wherein the first and second resistors are identical.

15. A method according to claim 13, wherein each of the first and second analog switches comprises a MOS transistor.

16. A differential amplifier comprising;
a differential pair of transistors comprising
a first transistor including a first conduction terminal, and a second conduction terminal forming a first output node of the amplifier, and
a second transistor including a first conduction terminal connected to the first conduction terminal of said first transistor, and a second conduction terminal forming a second output node of the amplifier;
a first inductive load connected between the first output node and a supply reference, and a second inductive load connected between the second output node and the supply reference; and
a limiting network for limiting output voltages on the first and second output nodes, and comprising
a first resistor connected to the first output node, and a second resistor connected to the second output node, said first and second resistors also connected together in series at a common intermediate node, and
a first analog switch connected to said first resistor and to the supply reference, said first analog switch comprises a first transistor switch including a control terminal connected to the common intermediate node, a first conducting terminal connected to the first output node, and a second conducting terminal connected to the supply reference, and
a second analog switch connected to said second resistor and the supply reference via said first analog switch, said second analog switch comprising a second transistor switch including a control terminal connected to the common intermediate node, a first conducting terminal connected to the second output node, and a second conducting terminal connected to the second conducting terminal of said first transistor switch,
said first and second analog switches being turned on when a voltage on the common intermediate node exceeds a threshold.

17. A differential amplifier according to claim 16, further comprising:
a first voltage limiting diode connected between the first output node and the first conducting terminal of said first transistor switch; and
a second voltage limiting diode connected between the second output node and the first conducting terminal of said second transistor switch.

18. A differential amplifier according to claim 17, further comprising a third voltage limiting diode having a first terminal connected to the control terminals of said first and second transistor switches, and a second terminal connected to the second conduction terminals of said first and second transistor switches for limiting an inverse voltage between said first and second transistor switches.

19. A differential amplifier according to claim 16, wherein each of said first and second transistor switches comprises a bipolar transistor.

20. A method for making a differential amplifier comprising;
- forming a differential pair of transistors comprising
  - a first transistor including a first conduction terminal, and a second conduction terminal forming a first output node of the amplifier, and
  - a second transistor including a first conduction terminal connected to the first conduction terminal of the first transistor, and a second conduction terminal forming a second output node of the amplifier;
- connecting a first inductive load connected between the first output node and a supply reference, and connecting a second inductive load between the second output node and the supply reference; and
- forming a limiting network for limiting output voltages on the first and second output nodes, and comprising
  - connecting a first resistor to the first output node, and connecting a second resistor connected to the second output node, the first and second resistors also being connected together in series at a common intermediate node, and
  - connecting a first analog switch to the first resistor and to the supply reference, the first analog switch comprising a first transistor switch including a control terminal connected to the common intermediate node, a first conducting terminal connected to the first output node, and a second conducting terminal connected to the supply reference, and
  - connecting a second analog switch connected to the second resistor and the supply reference via the first analog switch, the second analog switch comprising a second transistor switch including a control terminal connected to the common intermediate node, a first conducting terminal connected to the second output node, and a second conducting terminal connected to the second conducting terminal of the transistor switch,
  - the first and second analog switches being turned on when a voltage on the common intermediate node exceeds a threshold.

21. A method according to claim 20, further comprising:
- connecting a first voltage limiting diode between the first output node and the first conducting terminal of the first transistor switch; and
- connecting a second voltage limiting diode between the second output node and the first conducting terminal of the second transistor switch.

22. A method according to claim 21, further comprising connecting a first terminal of a third voltage limiting diode to the control terminals of the first and second transistor switches, and connecting a second terminal of the third voltage limiting diode to the second conduction terminals of the first and second transistor switches for limiting an inverse voltage between the first and second transistor switches.

23. A method according to claim 22, wherein each of the first and second transistor switches comprises a bipolar transistor.

* * * * *